US011177135B2

(12) United States Patent
Matsubara et al.

(10) Patent No.: US 11,177,135 B2
(45) Date of Patent: Nov. 16, 2021

(54) MASK MEMBER AND METHOD FOR PRODUCING SEMICONDUCTOR DEVICE

(71) Applicant: TOSHIBA MEMORY CORPORATION, Tokyo (JP)

(72) Inventors: Yuya Matsubara, Yokkaichi Mie (JP); Masayuki Kitamura, Yokkaichi Mie (JP); Atsuko Sakata, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/283,570

(22) Filed: Feb. 22, 2019

(65) Prior Publication Data

US 2020/0075341 A1 Mar. 5, 2020

(30) Foreign Application Priority Data

Aug. 29, 2018 (JP) ............................ JP2018-160545

(51) Int. Cl.

| | |
|---|---|
| ***H01L 21/3065*** | (2006.01) |
| ***H01L 27/11582*** | (2017.01) |
| ***H01L 21/311*** | (2006.01) |
| ***H01L 21/033*** | (2006.01) |
| ***H01L 21/308*** | (2006.01) |
| ***H01L 21/02*** | (2006.01) |
| ***H01L 21/3213*** | (2006.01) |

(52) U.S. Cl.

CPC .... *H01L 21/3065* (2013.01); *H01L 21/02274* (2013.01); *H01L 21/033* (2013.01); *H01L 21/0332* (2013.01); *H01L 21/0337* (2013.01); *H01L 21/308* (2013.01); *H01L 21/3081* (2013.01); *H01L 21/31116* (2013.01); *H01L 21/31144* (2013.01); *H01L 21/32139* (2013.01); *H01L 27/11582* (2013.01)

(58) Field of Classification Search

None

See application file for complete search history.

(56) References Cited

U.S. PATENT DOCUMENTS

| | | | |
|---|---|---|---|
| 9,026,366 B2 | 5/2015 | Jeong | |
| 9,059,089 B2 | 6/2015 | Harada et al. | |
| 9,388,495 B2 | 7/2016 | Watanabe et al. | |
| 9,754,793 B2 | 9/2017 | Nakao et al. | |
| 9,852,907 B2 | 12/2017 | Watanabe et al. | |
| 2017/0186766 A1* | 6/2017 | Kitao | H01L 27/11582 |
| 2018/0218902 A1* | 8/2018 | Venkatasubramanian | H01L 21/31122 |

FOREIGN PATENT DOCUMENTS

| | | |
|---|---|---|
| JP | 2014-187269 A | 10/2014 |

* cited by examiner

*Primary Examiner* — Jiong-Ping Lu

(74) *Attorney, Agent, or Firm* — Foley & Lardner LLP

(57) ABSTRACT

A mask member contains tungsten (W), boron (B), and carbon (C). The mask member includes a first portion in contact with a process film, the first portion, in which the terms of the composition ratio, which correspond to boron and carbon, are larger than the term of the composition ratio, which corresponds to tungsten, and a second portion in which the term of the composition ratio, which corresponds to tungsten, is larger than the terms of the composition ratio, which correspond to carbon and boron.

15 Claims, 8 Drawing Sheets

10
12
11
20
22
21
22
21
22
21
30
Z
Y
X

MASK MEMBER AND METHOD FOR PRODUCING SEMICONDUCTOR DEVICE

CROSS-REFERENCE TO RELATED APPLICATIONS

This application is based upon and claims the benefit of priority from. Japanese Patent Application No. 2018-160545, filed Aug. 29, 2018, the entire contents of which are incorporated herein by reference.

FIELD

Embodiments described herein relate generally to mask members and methods for producing a semiconductor device.

BACKGROUND

Semiconductor device production processes may include a process of working on a silicon-containing film to be worked on. In this process, a mask member containing, for example, tungsten (W), boron (B), and carbon (C) is sometimes used.

DETAILED DESCRIPTION

At least one embodiment provides a mask member that enhances the adhesion between the mask member and a film to be worked on and a method for producing a semiconductor device by using the mask member.

In general, according to at least one embodiment, a mask member contains tungsten (W), boron (B), and carbon (C). This mask member includes a first portion in contact with a film to be worked on, the first portion in which the terms of the composition ratio, which correspond to boron and carbon, are larger than the term of the composition ratio, which corresponds to tungsten, and a second portion in which the term of the composition ratio, which corresponds to tungsten, is larger than the terms of the composition ratio, which correspond to carbon and boron.

Hereinafter, at least one embodiment will be described with reference to the drawings. The embodiments are not intended for limitation.

Figure 1:
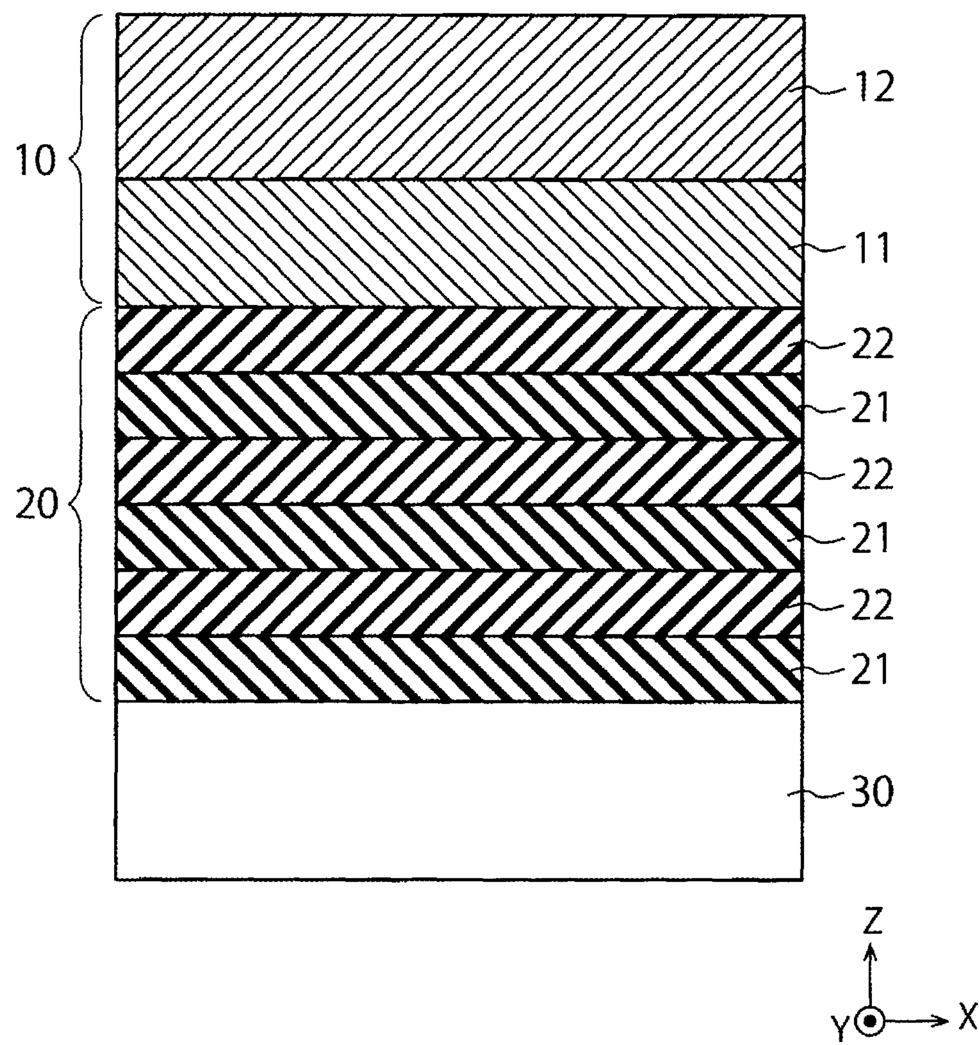
FIG. 1 is a sectional view depicting the schematic configuration of a mask member according to at least one embodiment.

FIG. 1 is a sectional view depicting the schematic configuration of a mask member according to at least one embodiment. FIG. 1 shows a state in which a mask member 10 according to at least one embodiment is formed on a stacked body 20.

The stacked body 20 is an example of a film to be worked on and is provided on a semiconductor substrate 30. In the following description, two directions which are parallel to the semiconductor substrate 30 and intersect at right angles are referred to as an X direction and a Y direction. Moreover, a direction perpendicular to the semiconductor substrate 30 is referred to as a Z direction.

In the stacked body 20, a first film 21 and a second film 22 are alternately stacked in the Z direction. The first film 21 is, for example, a silicon oxide film ($SiO_2$). The second film 22 is, for example, a silicon nitride film (SiN). The film to be worked on is not limited to the stacked body 20 and may be a single-layer body. Moreover, the film to be worked on is not limited to an insulating film such as a silicon oxide film or a silicon nitride film and may be a conductive film.

The mask member 10 includes a transition region 11 and a bulk region 12. The transition region 11 and the bulk region 12 are an example of a first region and an example of a second region, respectively. Each of the transition region 11 and the bulk region 12 contains tungsten, boron, and carbon. Here, the composition ratio of tungsten, boron, and carbon in each region will be described with reference to FIG. 2.

Figure 2:
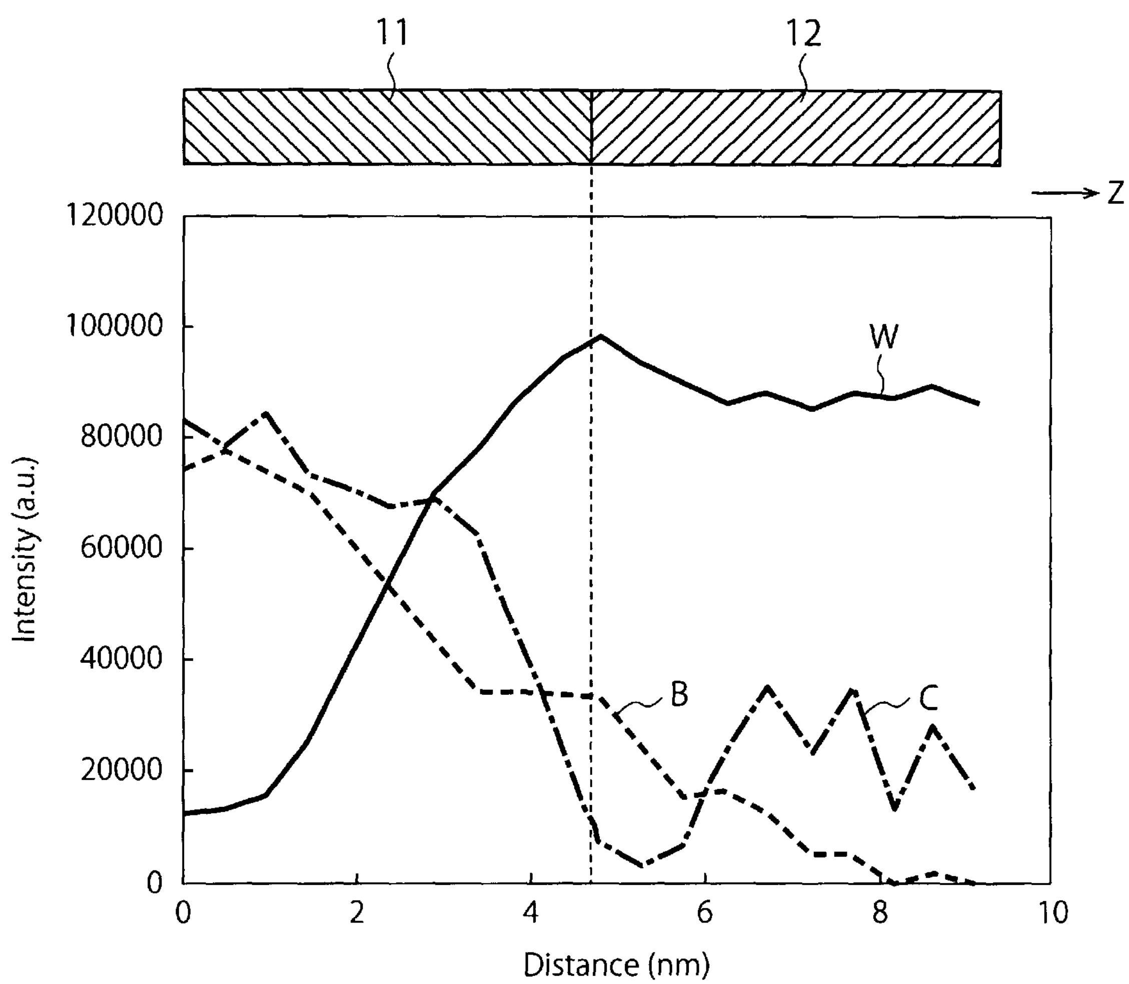
FIG. 2 is a diagram showing an example of the composition ratio of tungsten, boron, and carbon in the mask member according to at least one embodiment.

FIG. 2 is a diagram showing an example of the composition ratio of tungsten, boron, and carbon in the mask member 10. In FIG. 2, the horizontal axis represents the distance from the boundary between the mask member 10 and the stacked body 20 in the Z direction, that is, the position in the mask member 10. On the other hand, the vertical axis represents a content in the mask member 10. A solid line indicates the content of tungsten, a dotted line indicates the content of boron, and an alternate long and short dashed line indicates the content of carbon. In FIG. 2, each content is shown as the intensity (Intensity) in atomic units (a.u.) obtained by a mass analysis such as electron energy loss spectroscopy (EELS), for example.

As shown in FIG. 2, while the contents of tungsten, boron, and carbon continuously change in the transition region 11, the contents of tungsten, boron, and carbon are nearly constant in the bulk region 12. In other words, the composition ratio of tungsten, boron, and carbon has a greater change in the transition region 11 than in the bulk region 12. The bulk region 12 has a function as a mask necessary to work on the stacked body 20, for instance, and the transition region 11 has a function as an adhesion layer that enhances the adhesion between the stacked body 20 and the bulk region 12, for instance. It is therefore desirable that the composition ratio of tungsten, boron, and carbon in the bulk region 12 is nearly constant as described above.

Furthermore, in the transition region 11, the content of tungsten continuously increases from the boundary between the transition region 11 and the stacked body 20 to the boundary between the transition region 11 and the bulk region 12, that is, from the left side to the right side of FIG. 2. In contrast, the contents of boron and carbon continuously decrease from the boundary between the transition region 11 and the stacked body 20 to the boundary between the transition region 11 and the bulk region 12. As a result, in the bulk region 12, the content of tungsten is higher than the contents of boron and carbon. That is, the transition region 11 includes a first portion which is the boundary between the transition region 11 and the stacked body 20, the first portion in which the contents of boron and carbon are higher than the content of tungsten, and a second portion which is the boundary between the transition region 11 and the bulk region 12, the second portion in which the content of tungsten is higher than the contents of boron and carbon.

In at least one embodiment, the transition region 11 of the mask member 10 is in contact with the stacked body 20 which is the film to be worked on. In this transition region 11, the composition ratio of tungsten, boron, and carbon changes as shown in FIG. 2, for example. Specifically, in a contact surface between the transition region 11 and the stacked body 20, while the term of the composition ratio, which corresponds to tungsten, is made smaller, the terms of the composition ratio, which correspond to boron and carbon, are made larger. As a result, the adhesion between the mask member 10 and the stacked body 20 is enhanced. The experimental results reveal that, as for the composition of the transition region 11, when the percentage of tungsten is higher than 40% and the ratio (C/B) of the content of carbon to the content of boron is greater than 0.9 and smaller than 1.4, the mask member 10 does not become separated from the stacked body 20.

Hereinafter, a method for producing a semiconductor device by using the mask member 10 will be described.

Figure 3:
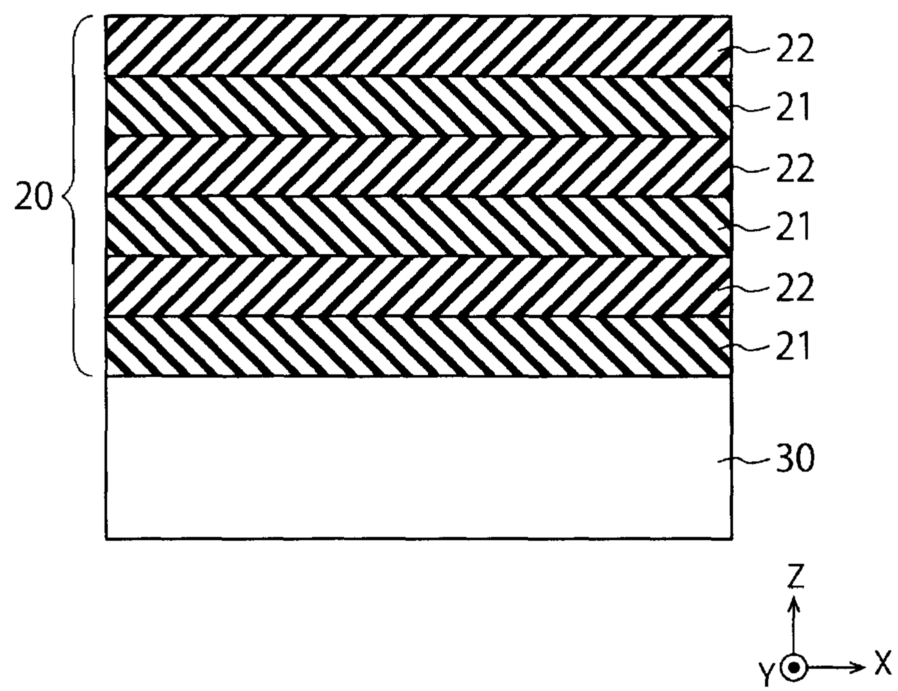
FIG. 3 is a sectional view depicting a stacked body formation process.

As depicted in FIG. 3, first, the stacked body 20 is formed on the semiconductor substrate 30. Specifically, the first film 21 and the second film 22 are alternately formed by using, for instance, chemical vapor deposition (CVD) or atomic layer deposition (ALD).

Next, as depicted in FIG. 1, the mask member 10 is formed on the uppermost surface of the stacked body 20. The mask member 10 may be formed by using a first gas containing tungsten, a second gas containing boron, and a third gas containing carbon. As the first gas, gases containing at least one of tungsten hexafluoride ($WF_6$), tungsten hexachloride ($WCl_6$), and hexacarbonyltungsten ($W(CO)_6$), for example, may be used.

As the second gas, gases containing at least one of diborane ($B_2H_6$), boron trifluoride ($BF_3$), boron trichloride ($BCl_3$), and boron tribromide ($B(Br_3)$) may be used. As the third gas, gases containing at least one of methane ($CH_4$), ethane ($C_2H_6$), propane ($C_3H_8$), isobutane ($C_4H_{10}$), ethylene ($C_2H_4$), propylene ($C_3H_6$), isobutylene ($C_4H_8$), acetylene ($C_2H_2$), propyne ($C_3H_4$), and butadiene ($C_4H_6$) may be used.

The mask member 10 may be formed by plasma CVD using the first to third gases, for example. Specifically, the first to third gases are introduced into a chamber (which is not depicted in the drawing) in which plasma is created. In the following description, the rates of flow of the first to third gases at the time of formation of the mask member 10 will be described with reference to FIG. 4.

Figure 4:
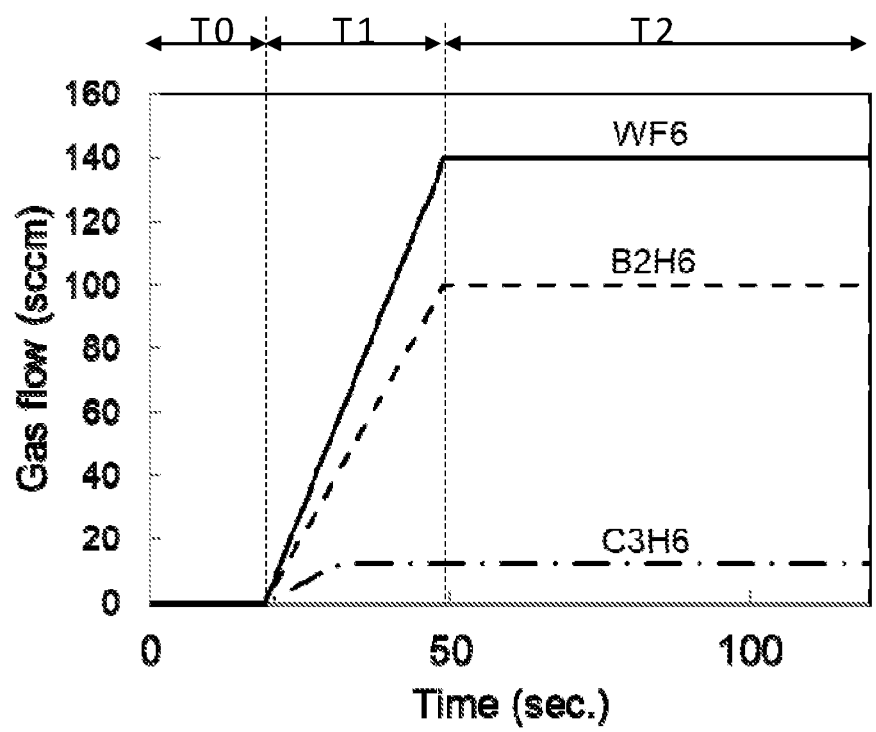
FIG. 4 is a graph showing an example of changes in the rates of flow of first to third gases at the time of formation of the mask member according to at least one embodiment.

FIG. 4 is a graph showing an example of changes in the rates of flow of the first to third gases at the time of formation of the mask member 10. In FIG. 4, the horizontal axis represents time. On the vertical axis, a scale of the rate of flow of each of tungsten hexafluoride ($WF_6$) gas, which is the first gas, diborane ($B_2H_6$) gas, which is the second gas, and propylene ($C_3H_6$) gas, which is the third gas, is provided.

As shown in FIG. 4, first, in a pretreatment time period T0 before the introduction of the first to third gases into the chamber, the air inside the chamber is exhausted by introducing inert gas. As the inert gas, nitrogen gas, for example, may be used.

Then, in a first treatment time period T1, the first gas ($WF_6$), the second gas ($B_2H_6$), and the third gas ($C_3H_6$) are introduced into the chamber with the rates of flow thereof being changed. As a result, the transition region 11 is formed on the uppermost surface of the stacked body 20. At this time, the amount of change in the rate of flow of each gas per unit time, that is, the gradient of each line shown in FIG. 4, is adjusted so as to obtain the composition ratio of tungsten, boron, and carbon shown in FIG. 2, for example. For instance, the amount of change in the rate of flow of the first gas ($WF_6$) is made larger than the amount of change in the rate of flow of each of the second gas ($B_2H_6$) and the third gas ($C_3H_6$). This makes it possible to form the transition region 11 with good adhesion to the stacked body 20.

Then, in a second treatment time period T2, the first gas ($WF_6$), the second gas ($B_2H_6$), and the third gas ($C_3H_6$) are introduced into the chamber with the rates of flow thereof being fixed. As a result, the bulk region 12 in which the composition ratio of tungsten, boron, and carbon is nearly constant is formed on the upper surface of the transition region 11, and the mask member 10 is completed. In the present embodiment, since plasma is used as described above, the mask member 10 may be formed at low temperatures.

Figure 5:
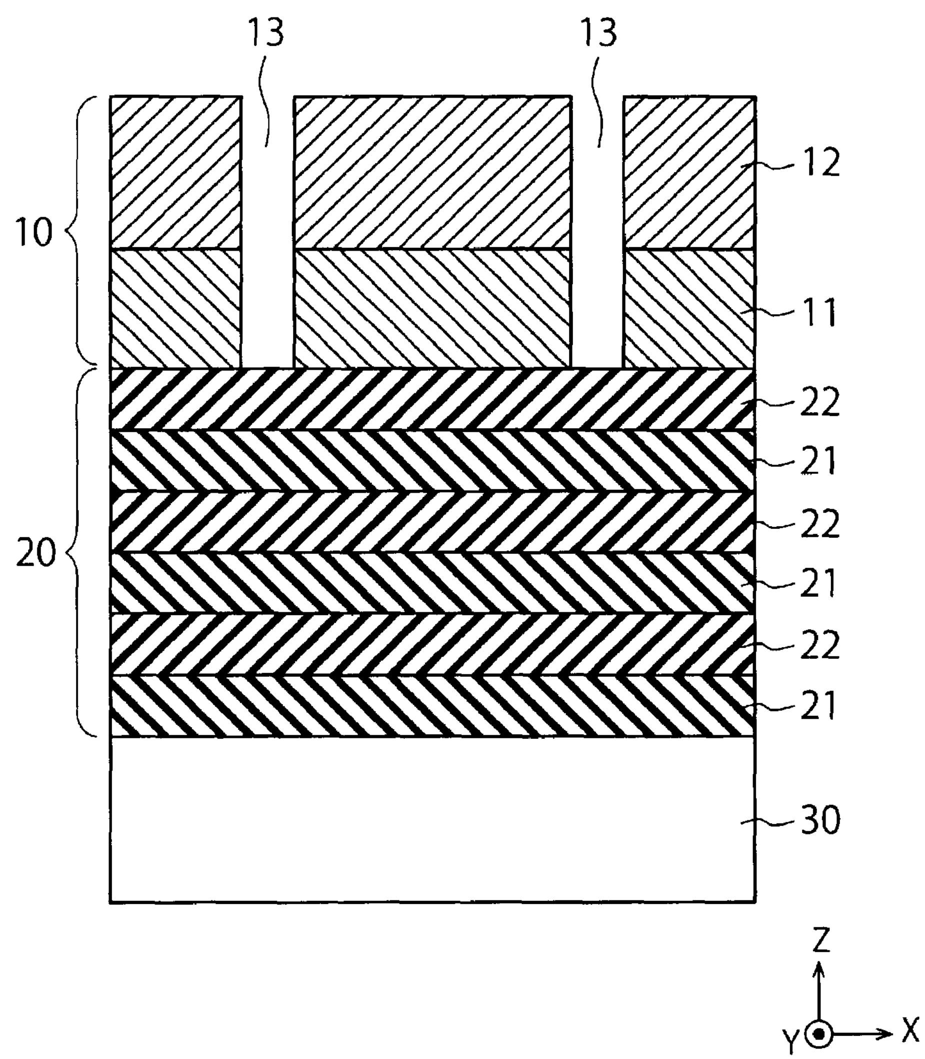
FIG. 5 is a sectional view depicting a process of forming a pattern of the mask member according to at least one embodiment.

Next, as depicted in FIG. 5, hollow portions 13 passing through the bulk region 12 and the transition region 11 are formed. As a result, a pattern is formed in the mask member 10. The hollow portions 13 may be formed by reactive ion etching (RIE), for example.

Figure 6:
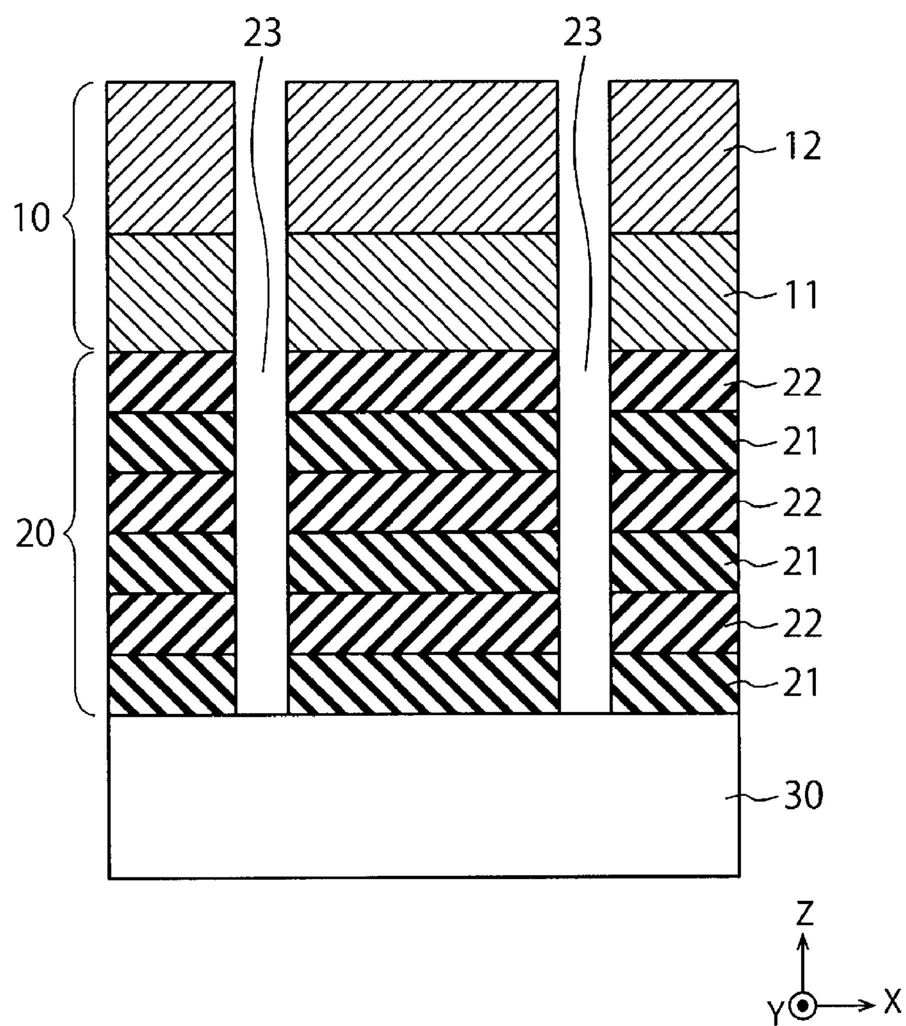
FIG. 6 is a sectional view depicting a process of working on a stacked body.

Next, as depicted in FIG. 6, hollow portions 23 are formed in the stacked body 20 based on the pattern of the mask member 10. The hollow portions 23 communicate with the hollow portions 13 and pass through the stacked body 20. The hollow portions 23 may be formed by RIE, for example.

Figure 7:
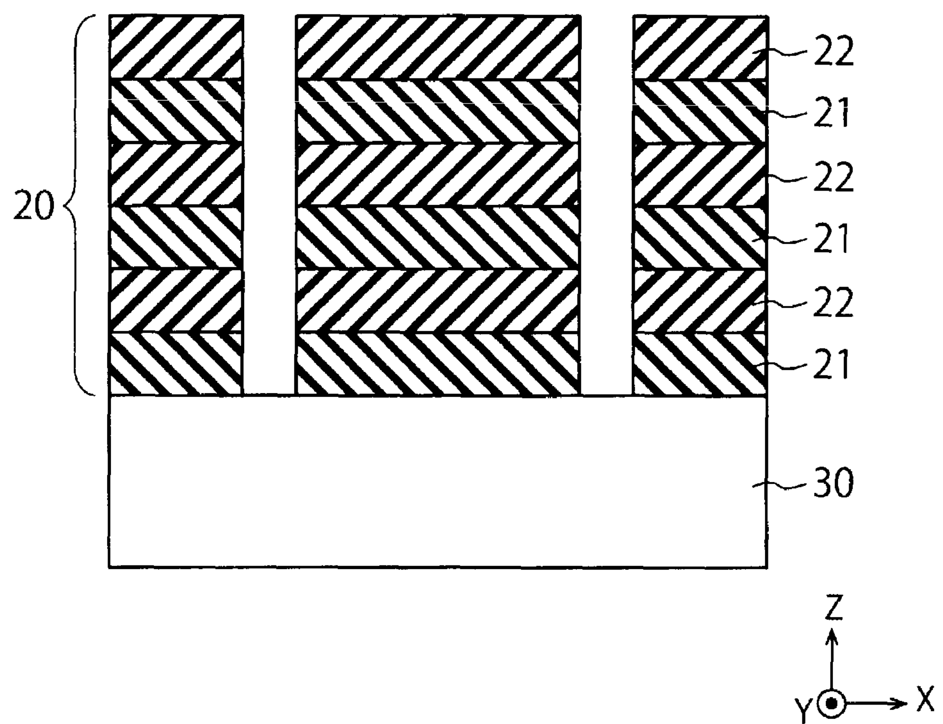
FIG. 7 is a sectional view depicting a process of removing the mask member according to at least one embodiment.

Next, as depicted in FIG. 7, the mask member 10 is removed. The mask member 10 may be removed by using a chemical solution. For instance, when a hydrogen peroxide ($H_2O_2$) solution is used as the chemical solution, it is possible to remove the mask member 10 without causing damage to the stacked body 20. At this time, if the transition region 11 is a film formed only of boron and carbon, this film cannot be removed by the hydrogen peroxide solution.

In at least one embodiment, however, the transition region 11 contains not only boron and carbon, but also tungsten. Thus, the mask member 10 ensures sufficient adhesion between the mask member 10 and the stacked body 20 when the stacked body 20 is worked on and, furthermore, is reliably removed without damage to the stacked body 20.

Figure 8:
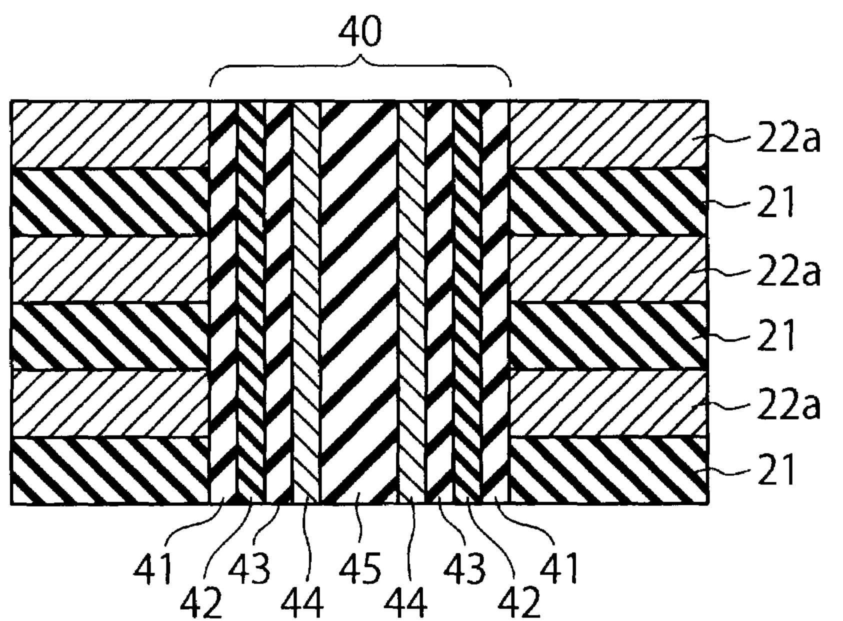
FIG. 8 is a sectional view depicting the structure of principal portions of a semiconductor device according to at least one embodiment.

After the removal of the mask member 10, a memory film 40, for example, may be formed in the hollow portion 23 as depicted in FIG. 8. Moreover, the second film 22 is replaced by a conductive film **22*a*. The conductive film 22*a*** is formed as a tungsten film, for instance, and functions as a word line. As a result, this semiconductor device functions as a semiconductor storage device of the stacked type.

The memory film 40 includes, for example, a charge block film 41, a charge storage film 42, a tunnel insulating film 43, a channel film 44, and a core film 45. The charge block film 41, the tunnel insulating film 43, and the core film 45 are formed as silicon oxide films, for instance. The charge storage film 42 is formed as a silicon nitride film, for instance. The channel film 44 is formed as a polysilicon film, for instance.

According to at least one embodiment described above, the mask member 10 includes the transition region 11 in contact with the film to be worked on, and, in this transition region 11, the composition ratio of tungsten, boron, and carbon continuously changes. As a result, it is possible to enhance the adhesion between the film to be worked on and the mask member 10 when the film to be worked on is worked on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for producing a semiconductor device, comprising:

forming a process film on a semiconductor substrate;

forming a mask member on the process film, wherein the mask member comprises:

a first region that includes (i) a first portion containing tungsten, boron, and carbon, the first portion having a greater amount of boron and carbon than tungsten, and (ii) a second portion containing tungsten, boron, and carbon, the second portion having a greater amount of tungsten than boron and carbon, the second portion having a smaller amount of boron than the first portion, and a second region containing tungsten, boron, and carbon, and having a greater amount of tungsten than boron and carbon, the second region being in contact with the second portion of the first region;

patterning the mask member; and processing the process film based on a pattern of the mask member, wherein forming the first region includes increasing a rate of flow of a gas containing the carbon during at least part of forming the first region.

2. The method according to claim 1, the method further comprising forming the first region while changing rates of flow of a first gas containing the tungsten, a second gas containing the boron, and a third gas containing the carbon.

3. The method according to claim 2, wherein after formation of the first region, forming the second region while fixing the rates of flow of the first gas, the second gas, and the third gas.

4. The method according to claim 2, further comprising forming the process film by alternately stacking a first film and a second film, each of the first film and the second film containing silicon.

5. The method according to claim 2, further comprising:

forming a pattern in the mask member, and forming a hollow portion in the process film based on the pattern.

6. The method according to claim 5, wherein the hollow portion is formed by reactive ion etching.

7. The method according to claim 1, further comprising forming the process film by alternately stacking a first film and a second film, each of the first film and the second film containing silicon.

8. The method according to claim 1, further comprising:

forming a pattern in the mask member, and forming a hollow portion in the process film based on the pattern.

9. The method according to claim 8, wherein the hollow portion is formed by reactive ion etching.

10. The method according to claim 1, further comprising forming the mask member by plasma chemical vapor deposition.

11. The method according to claim 1, wherein in the first region, a percentage of the tungsten is higher than 40% and a ratio of a content of the carbon to a content of the boron is greater than 0.9 and smaller than 1.4.

12. The method according to claim 1, wherein the second portion being in contact with the first portion.

13. The method according to claim 1, wherein the second portion having a higher amount of boron than the second region and the second portion having a lower amount of tungsten than the second region.

14. The method according to claim 1, wherein an upper portion of the second region having a higher amount of carbon than that of boron.

15. The method according to claim 1, wherein forming the first region while using a constant rate of flow of the gas containing the carbon during at least another part of forming the first region.

* * * * *